United States Patent
Grille et al.

(10) Patent No.: US 8,871,550 B2
(45) Date of Patent: Oct. 28, 2014

(54) METHOD FOR PROCESSING A WAFER AT UNMASKED AREAS AND PREVIOUSLY MASKED AREAS TO REDUCE A WAFER THICKNESS

(75) Inventors: Thomas Grille, Villach (AT); Ursula Hedenig, Villach (AT); Martin Zgaga, Rosegg (AT); Daniel Maurer, Feld am See (AT)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 13/480,295

(22) Filed: May 24, 2012

(65) Prior Publication Data

US 2013/0313661 A1 Nov. 28, 2013

(51) Int. Cl.
*H01L 21/00* (2006.01)
*H01L 29/84* (2006.01)
*H01L 21/306* (2006.01)

(52) U.S. Cl.
CPC .............................. *H01L 21/30608* (2013.01)
USPC ............. 438/50; 257/E21.219; 257/E29.324

(58) Field of Classification Search
CPC .. H01L 21/486; H01L 21/02; H01L 21/30608
USPC ...................... 257/E21.219, E29.324; 438/50
See application file for complete search history.

(56) References Cited

U.S. PATENT DOCUMENTS

| | | | |
|---|---|---|---|
| 4,975,390 A | 12/1990 | Fujii et al. | |
| 7,728,339 B1 | 6/2010 | Adams et al. | |
| 8,496,842 B2 * | 7/2013 | Udayakumar et al. | 216/66 |
| 2002/0127760 A1 | 9/2002 | Yeh et al. | |

* cited by examiner

*Primary Examiner* — Luan C Thai
(74) *Attorney, Agent, or Firm* — Slater & Matsil, L.L.P.

(57) ABSTRACT

A method for processing a wafer having microelectromechanical system structures at the first main surface includes applying a masking material at the second main surface and structuring the masking material to obtain a plurality of masked areas and a plurality of unmasked areas at the second main surface. The method further includes anisotropically etching the wafer from the second main surface at the unmasked areas to form a plurality of recesses. The masking material is then removed at least at some of the masked areas to obtain previously masked areas. The method further includes anisotropically etching the wafer from the second main surface at the unmasked areas and the previously masked areas to increase a depth of the recesses and reduce a thickness of the wafer at the previously masked areas.

25 Claims, 6 Drawing Sheets grinding application of masking material
(photo resist)

photolithography anisotropic etch

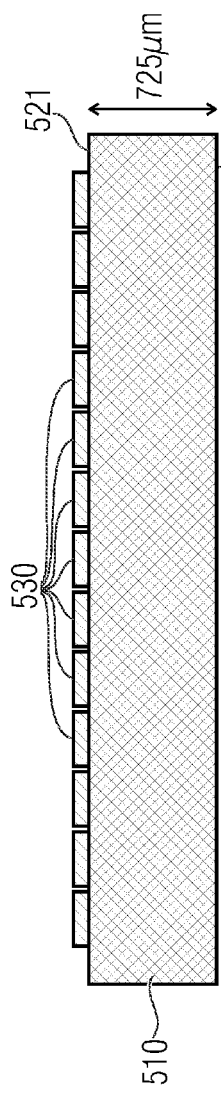
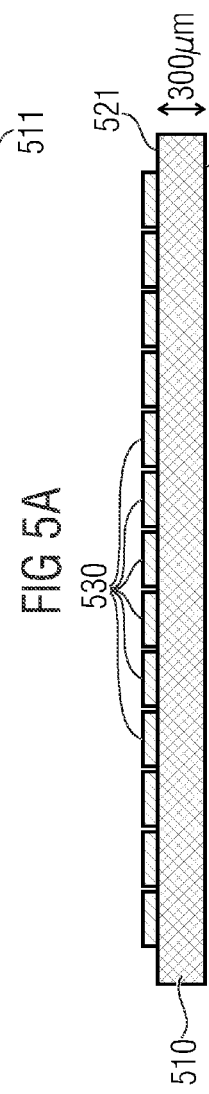
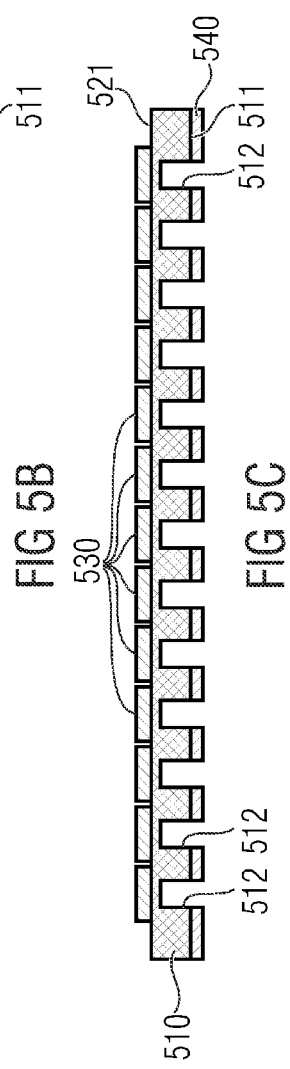
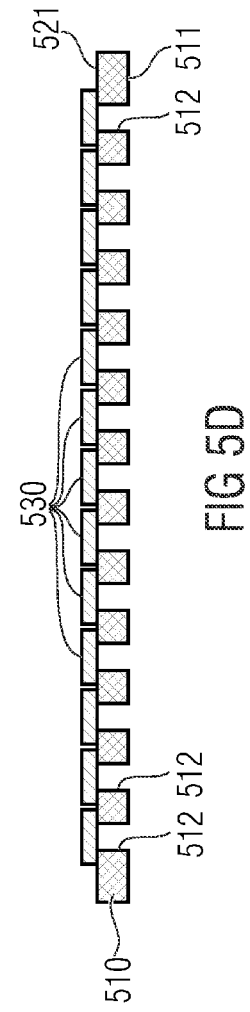

METHOD FOR PROCESSING A WAFER AT UNMASKED AREAS AND PREVIOUSLY MASKED AREAS TO REDUCE A WAFER THICKNESS

TECHNICAL FIELD

Embodiments of the present invention relate to a method for processing a wafer. Further embodiments of the present invention relate to a wafer. Further embodiments relate to a method for surface-wide Bosch etching (200 µm) for silicon microphones.

BACKGROUND

As electronics applications and also microelectromechanical systems (MEMS) shrink in size, research is conducted in order to reduce both footprint and thickness of the electronic components and/or MEMS employed for the various electronics and MEMS applications. There are several reasons for the desire and/or need to reduce the size of the components. In order to achieve a desired physical effect at a given scale, the component needs to have the appropriate size and proportion. For example, reducing a lateral size of a movable element of an acceleration sense may also lead to a reduced mass of the movable element. In order to maintain a desired sensitivity of the acceleration sensor, the stiffness of a suspension of the movable element needs to be reduced, which may require a reduction of the thickness of the suspension mechanism. Simply stated, a reduction of the size of an electronic structure or an MEMS structure typically may involve a reduction of size in all three dimensions in order to maintain the proportions and thus a desired behavior of the component.

From an economical point of view, a size reduction means that more integrated circuits or MEMS devices may fit on a wafer of a given size, thus leading to reduced manufacturing costs per circuit or device.

Some MEMS devices require not only processing at a front surface of the wafer, but also a processing from a back surface of the wafer. Typically, a major part of the MEMS structure is formed at the front surface so that one or more cavities are formed from the back surface all the way through the wafer to the front surface, in order to facilitate the manufacturing steps that need to be performed from the back surface. The one or more cavities may be formed by means of various etching processes, such as wet etching processes or dry etching processes. With wet etching processes typically only relatively small aspect ratios for the cavities can be achieved, i.e., in order to reach a desired depth, the cavities need to be relatively wide at the back surface. Hence, the MEMS structures cannot be placed too close to each other, which results in a waste of wafer estate.

Dry etching techniques, on the other hand, yield high aspect ratios, but are relatively slow and therefore expensive. In particular, the equipment that is needed for dry etching is typically expensive and if one batch takes more than one full day, a large number of dry etching equipment is needed when a desired capacity or throughput is to be reached.

Another aspect that may need to be considered especially in connection with thin wafers is that some techniques for wafer thinning, in particular mechanical techniques such as grinding, can only be used down to a certain minimal wafer thickness. Beneath this minimal wafer thickness mechanical wafer thinning techniques bear a high risk of damaging the wafer and/or the MEMS structures formed at the (front) surface of the wafer.

SUMMARY OF THE INVENTION

Embodiments of the present invention provide a method for processing a wafer having a first main surface and a second main surface. Microelectromechanical system structures are arranged at the first main surface. The method comprises applying a masking material at the second main surface and structuring the masking material to obtain a plurality of masked areas and a plurality of unmasked areas at the second main surface. The method also comprises anisotropically etching the wafer from the second main surface at the unmasked areas to form a plurality of recesses. Furthermore, the method comprises removing the masking material at least at some of the masked areas to obtain previously masked areas. The method also comprises anisotropically etching the wafer from the second main surface at the unmasked areas and the previously masked areas to increase a depth of the recesses and reduce a thickness of the wafer at the previously masked areas.

Further embodiments of the present invention provide a wafer comprising a stack of a bulk material and an insulating material, a plurality of microelectromechanical system structures, and a plurality of recesses. The insulating material forms a first main surface of the wafer and the bulk material forms a second main surface of the wafer. The stack has a thickness between 150 µm and 250 µm extending from the first main surface to the second main surface. The plurality of microelectromechanical systems structures are arranged at the first main surface. Each recess of the plurality of recesses extends from the second main surface through the bulk material and the insulating material to a corresponding microelectromechanical system structure of the plurality of microelectromechanical system structures.

BRIEF DESCRIPTION OF THE DRAWINGS

Embodiments of the present invention will be described using the accompanying figures, in which:

FIGS. 5A to 5D show schematic cross sections of a wafer during different stages of a method for processing a wafer according to embodiments.

DETAILED DESCRIPTION OF ILLUSTRATIVE EMBODIMENTS

Before embodiments of the invention will be described in the following in detail using the accompanying figures, it is to be pointed out that the same elements or elements having the same functionality are provided with the same reference numbers or with similar reference numbers and that a repeated description of elements provided with the same/similar reference numbers is omitted. Hence, descriptions provided for elements having the same/similar reference numbers are mutually exchangeable.

Figure 1:
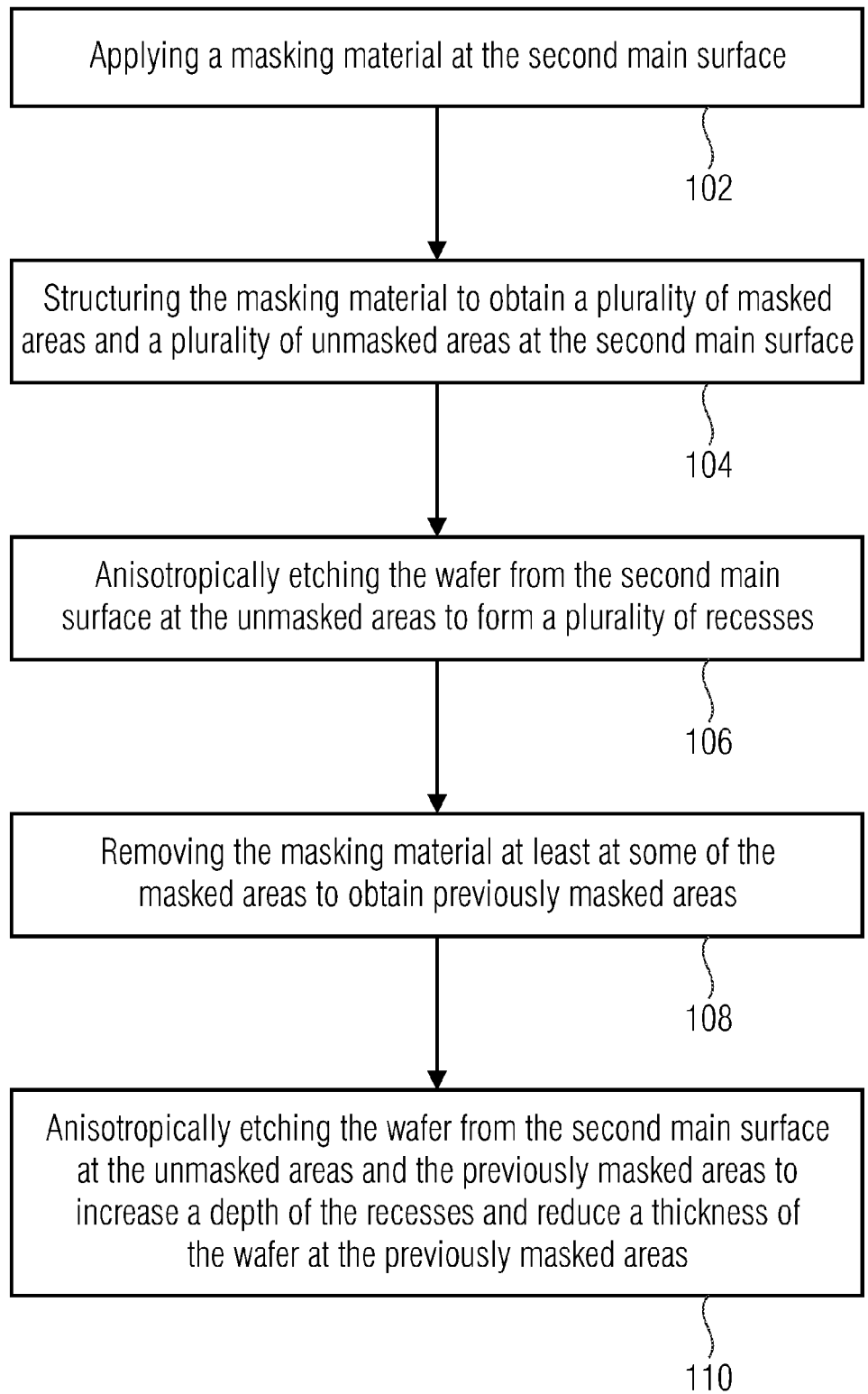
FIG. 1 is a schematic flow diagram of a method for processing a wafer according to embodiments.

FIG. 1 shows a schematic flow diagram of a method for processing a wafer. The method starts off with a wafer which has already undergone some sort of processing so that microelectromechanical system structures are arranged at a first main surface of the wafer. The microelectromechanical system (MEMS) structures may be finished or semi-finished. For example, a semi-finished MEMS structure may still comprise sacrificial material that has been used during the preceding manufacturing process in order to, for example, define future cavities or open spaces within the MEMS structure. Accordingly, such sacrificial material needs to be removed in order to complete the MEMS manufacturing process. The wafer also has a second main surface which is typically opposite to the first main surface. As can be seen in the schematic flow diagram of FIG. 1, the method comprises a step 102 of applying a masking material at the second main surface. The masking material may be a photoresist and its application to the second main surface may be achieved by means of, for example, a spin coating process. Depending on the method that is used to apply the masking material at the second main surface, the wafer may have to be mechanically manipulated and thus subjected to mechanical stress. In case such a method of masking material application is used, the wafer needs to have a certain minimal thickness, in order to reduce a risk of wafer breakage or damage to the microelectromechanical system structures at the first main surface.

At a step 104 the masking material is structured to obtain a plurality of masked areas and a plurality of unmasked areas at the second main surface. Structuring the masking material may be achieved by means of a photolithography performed at the second main surface of the wafer.

As indicated at a step 106 of the method schematically illustrated in the flow diagram of FIG. 1, the wafer is anisotropically etched from the second main surface at the unmasked areas to form a plurality of recesses. The recesses may later form holes, cavities, channels, etc. of the finished wafer or the finished MEMS devices, and thus may fulfill a function during the manufacturing and/or the operation of the microelectromechanical system structures at the first main surface. During the anisotropic etching step 106 the masked areas at the second main surface are substantially unaffected by the etching process.

The masking material is then removed at least at some of the masked areas to obtain previously masked areas, as indicated at a step 108. In particular, substantially the entire masking material may be removed from the second main surface so that the entire second main surface is exposed. Furthermore, any residual masking material that may still be present at the first main surface may also be removed during step 108. Removing the masking material may entail a removal of substantially all the masking material so that all masked areas are exposed, i.e. all masked areas become previously masked areas during the step 108.

At a step 110 the wafer is (again) anisotropically etched from the second main surface at the unmasked areas, and this time also at the previously masked areas are etched to increase a depth of the recesses and to reduce a thickness of the wafer at the previously masked areas. In case the previously masked areas make up substantially the entire second main surface (except for the plurality of recesses), the thickness of the entire wafer is reduced in a substantially uniform manner. At the same time, the recesses are further enlarged and may thus eventually reached an etch stop layer near the first main surface, or they may reach the first main layer directly. Note that some anisotropic etching processes may spare a rim area of the wafer so that the wafer thickness is not or only slightly reduced at this rim area. The rim area typically has a width in radial direction between 5 mm and 12 mm. Because of this effect, the term "entire area of the second main surface" may exclude the rim area in some embodiments.

Note that the steps 106, 108 and 110 do not require mechanical processing steps of the wafer. Therefore, the wafer thickness can be reduced in particular during the step 110 well below the threshold of minimal wafer thickness required for mechanical wafer thinning processes.

The step 110 combines two tasks, namely the completion of the recesses until they substantially reach all the way through to the corresponding microelectromechanical system structures at the first main surface, and the reduction of the wafer thickness. Thus, the etching process during step 110 that is mainly performed to obtain or finish the recesses, is also used for reducing the wafer thickness. Typically, there is no need to mechanically process the wafer subsequent to the step 110, except for wafer handling and transportation that do not pose a major risk for wafer breakage or other damage. In other words, anisotropically etching the wafer at the unmasked areas and the previously masked areas reduces the thickness of the wafer at the previously masked areas to a final wafer thickness. In embodiments, the final wafer thickness may be less than 250 μm. In further embodiments of the method for processing the wafer the final wafer thickness may be less than 230 μm, less than 210 μm, less than 200 μm, less than 180 μm, or even less than 170 μm. Intermediate values for the final wafer between 170 μm and 250 μm spaced at intervals of 1 μm are also disclosed.

In comparison, prior to step 102 and prior to applying a masking material at the second main surface, the wafer may have a thickness between 270 μm and 400 μm. Again, intermediate values spaced by intervals of 1 μm are also disclosed.

During the anisotropic etching process acting on the unmasked areas and the previously masked areas, a depth of the recesses may be increased by a value between 80 μm and 140 μm. At the same time, a thickness of the wafer may be reduced by an identical amount, i.e. between 80 μm and 140 μm. Note, however, that the increase of the depth of the recesses may come to a stop once an etch stop layer is reached, while the reduction of the wafer thickness may still continue as long as the anisotropic etching process lasts.

In addition to the process steps schematically shown in FIG. 1, the method for processing the wafer may further comprise a step of reducing a given thickness of the wafer prior to applying the masking material, i.e. prior to step 102, by a mechanical process at the second main surface of the wafer. In particular, the mechanical process may comprise grinding the second main surface. The mechanical process may in particular, further, or alternatively comprise a TAIKO process. According to the TAIKO process, grinding of the second main surface does not occur across the entire area of the second main surface, but only within a central area of the second main surface. Thus, the TAIKO process leaves a rim or margin where the wafer substantially keeps its original thickness. The TAIKO process leads to wafers that are mechanically more stable due to the thicker edge area of the wafer. The TAIKO process probably has its name from the Japanese word "taiko," which means "drum."

The wafer may comprise an insulation layer (or insulating layer) at the first main surface adjacent to the microelectromechanical system structures. In particular, the insulation layer may separate the microelectromechanical system structures from a bulk material or substrate material of the wafer. The insulation layer may serve as an electrical insulation between the MEMS structures against the substrate, but also (or alternatively) it may function as an etch stop layer so that an etching of the recesses stops when the etch stop layer is reached, which may occur during the anisotropic etching process of step 110.

The insulation layer may be removed subsequent to the anisotropic etching process of step 110 by means of a different etching process. In particular, the different etching process may be selective to the material that is used for the insulation layer.

The method for processing the wafer may further comprise an optional step of releasing one or more components of the microelectromechanical system structures by removing a sacrificial material within the microelectromechanical system structure. This optional step may be performed subsequent to the anisotropic etching of the wafer at the unmasked areas and the previously masked areas. The sacrificial material may be removed by means of a wet etching process or an ashing process. In case the sacrificial material and the material of the previously mentioned insulation layer are chosen in an appropriate manner, the insulation layer may be removed, at least within the recesses, by means of the same process that is used for removing the sacrificial material within the microelectromechanical system structures.

The steps 106 and 110 during which the wafer is anisotropically etched from the second main surface may spare a rim area of the wafer. This may be caused by an aperture or by the structure of an electrical field that is used for the anisotropic etching process. In particular during step 110, the thickness of the wafer may hence not be substantially reduced in the rim area. The resulting rim of substantially original wafer thickness enhances a mechanical stability of the wafer and may thus facilitate further handling of the wafer. In this respect, the wafer thinning process based on anisotropically etching the wafer exhibits a similar behavior as the above mentioned mechanical TAIKO process. In other words, such a process step may be regarded as a non-mechanical TAIKO process or an etching-based TAIKO process.

The step 106 of anisotropically etching the wafer from the second main surface at the unmasked areas may be a time controlled process.

The wafer may have a diameter of at least 200 mm, which is approximately equal to 8 in. The combination of relatively large wafer diameters (e.g., 200 mm and up) with ever smaller wafer thickness presents a challenge with respect to the need for the wafer to withstand subsequent manufacturing steps. Embodiments disclosed herein propose a solution for obtaining large-diameter, thin wafers.

According to some embodiments, the microelectromechanical system structures may be sound transducers. For example, the sound transducers may be microphones or loudspeakers. Sound transducers in MEMS technology typically are electrostatic loudspeakers, although other driving principles are, of course, possible and imaginable. Electrostatic MEMS sound transducers typically comprise a membrane and one or two counter electrodes. During operation of the sound transducer the membrane may oscillate within a volume of the MEMS sound transducer. This volume is typically filled by a sacrificial material during the manufacturing of the MEMS sound transducer. Furthermore, an MEMS sound transducer may have a back volume or back cavity which has an influence on the mechanical behavior of the membrane and the resonance behavior of the sound transducer. Therefore, it is typically desirable to design and size the back volume in accordance with the desired properties of the sound transducers. A good design and choice of the size of the back volume may improve, for example, a signal-to-noise ratio (SNR) and/or an efficiency of the sound transducer. For example, some applications of MEMS sound transducers may call for a height of the back volume of approximately 200 µm. The back volume may be formed from a second main surface of the MEMS sound transducer so that it is open at the second surface. In these cases, the back volume is typically later closed by attaching the MEMS sound transducer to another substrate or chip which may comprise driving circuitry for the MEMS sound transducer and/or other signal processing circuitry. In such an arrangement, the height of the back volume is substantially equal to the height of the MEMS sound transducer, and thus to the final wafer thickness.

An example for an actual application of MEMS sound transducers is Infineon's DSOUND product family. Taking into account the above discussed requirements for appropriate shape and size of the back volume of the silicon microphones, a component height of approximately 200 µm is to be realized for the DSOUND product family. However, due to the characteristics of the product, no support material is currently feasible or useable. Simulations of the embodiments proposed herein and the first pre-trials suggest improvements in manufacturing, processing, signal-to-noise ratio and/or costs. In addition, a capacity gain of approximately 25% of the processing capacity of the Bosch etching equipment (e.g., Aviza Bosch etching chambers) appears to be feasible.

Within the DSOUND product family, no product was previously available, which has been created with a component height of 200 µm. To the knowledge of the inventors, the inventors are the first to be able to manufacture 200 µm thick, 8 in. wafers with DSOUND microphones.

Up to now, a manufacturing process was used by the assignee according to which the wafer was etched to a thickness of 400 µm and subsequently "perforated" at the back side (second main surface) by means of a Bosch etch process with 18,000 holes.

According to the proposed method for processing, instead of etching and perforating the wafer, a grinding is performed on the wafer to reduce a wafer thickness by an additional 100 µm, i.e. to a thickness of approximately 300 µm. Then a time-controlled Bosch process is performed so that the cavity or the cavities extend into the wafer by 200 µm only. Subsequently, the wafer is completely stripped from photoresist and then surface-wide etched by 100 µm in the Aviza Bosch etching reactor. In this manner, a plasma thinning process is provided instead of a mechanical process. The wafer is processed in a very gentle manner.

Since there is no photoresist at the front surface and the back surface, the wafer is thus directly brought to the release etching process, during which the gap of the microphone is release etched. Processing of the wafer is now completed. Please note that the above description of a possible method of processing a wafer is an example only which shall not be construed as limiting in any way.

Embodiments provide a shift of the thinning process to one quarter of the final wafer thickness more to a mechanical grinding process, resulting in a savings of 25% of the time required for Bosch etching. Furthermore, a lithography process after the Bosch etching process can be dispensed with, as well as any further photolithography steps at the 200 µm thick state of the wafer. An increased yield can typically be expected when using at least some of the embodiments.

Figure 2:
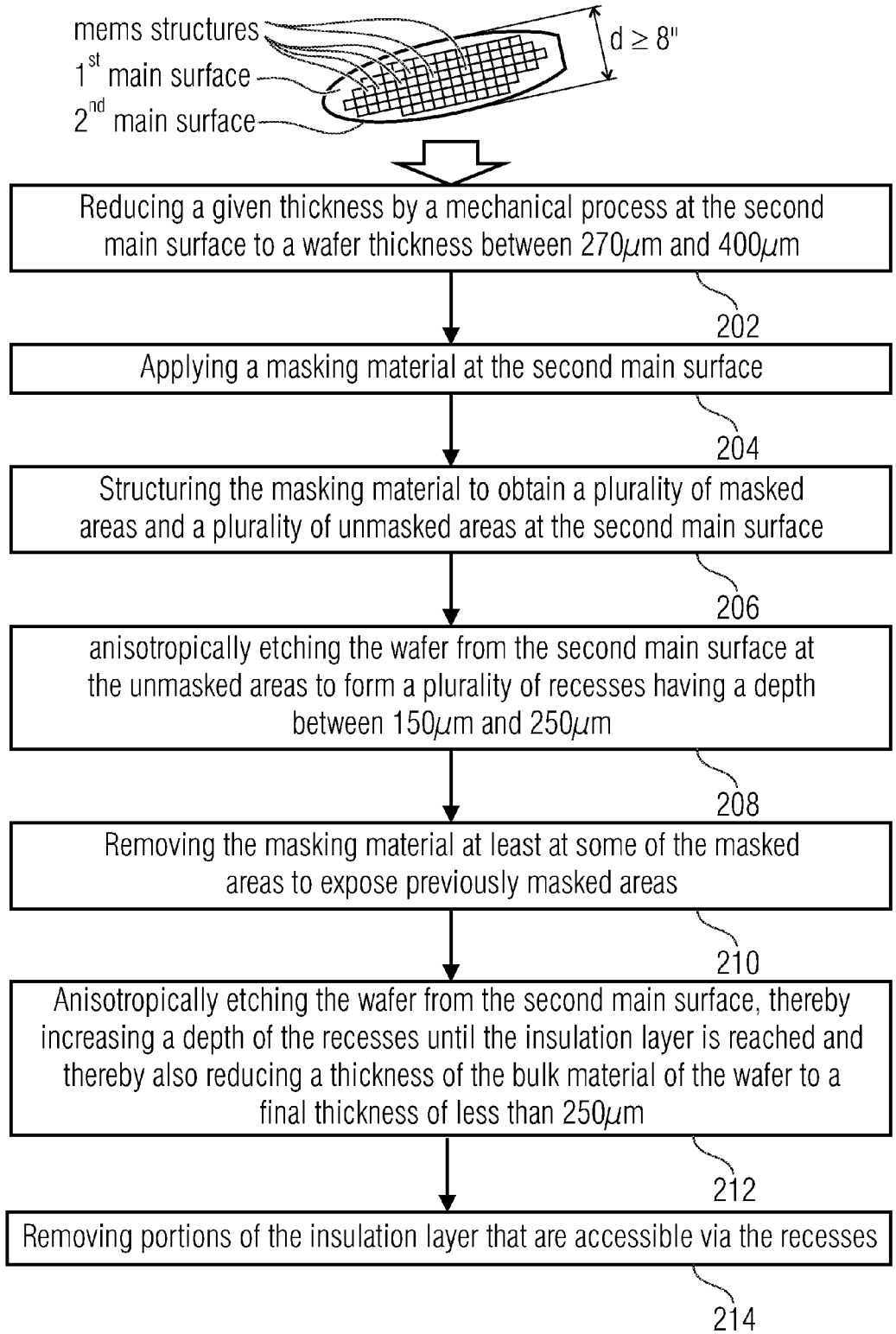
FIG. 2 is a schematic flow diagram of a method for processing a wafer according to further embodiments.

FIG. 2 shows a schematic flow diagram of a method for processing a wafer according to further embodiments. The method starts off with a wafer having a diameter of at least 8 inches, or approximately 200 mm. The wafer has a first main surface and a second main surface. Microelectromechanical system structures (MEMS structures) are arranged at the first main surface. An insulation layer separates the microelectromechanical system structures from a bulk material of the wafer.

The method begins with a step 202, during which a given thickness of the wafer is reduced by a mechanical process performed at the second main surface. The mechanical process yields a wafer having a wafer thickness between 270 μm and 400 μm (intermediate values with an interval of 1 μm are also disclosed). A masking material is then applied at the second main surface, as indicated at a step 204. The masking material may then be structured to obtain a plurality of masked areas and a plurality of unmasked areas at the second main surface (step 206).

According to a step 208, the wafer is anisotropically etched from the second main surface at the unmasked areas to form a plurality of recesses (e.g., cavities) having a depth between 150 μm and 250 μm (intermediate values with an interval width of 1 μm are also disclosed).

The masking material is then removed at least at some of the masked areas to expose (and thus obtain) previously masked areas, as indicated at a step 210 of the method for processing a wafer according to the flow diagram of FIG. 2.

A step 212 indicates that the wafer is again anisotropically etched from the second main surface, however this time not only at the bottoms of the recesses that have previously (step 208) been obtained by anisotropically etching the wafer at the unmasked areas, but also at the previously masked areas that have been exposed by the removal of the masking material at least at some of the masked areas during step 210. The anisotropically etching continues at least until the insulation layer (e.g., an oxide, a nitride, a carbide, silicon oxide, silicon nitride, or silicon carbide) is reached. At the same time as the recesses are enlarged in depth, a thickness of the wafer is reduced at the previously masked areas. A final thickness of the wafer is less than 250 μm, possible less than 220 μm, possible less than 200 μm, and maybe even less than 180 μm. The purpose of the anisotropic etching process at step 212 is to increase a depth of the recesses and to reduce a thickness of the wafer at the previously masked areas to the mentioned final thickness.

According to a step 214, portions of the insulation layer that are accessible through the recesses are removed. In addition, one or more components of the microelectromechanical system structures may be released either prior to step 214, subsequent to step 214, or concurrently with step 214, by removing a sacrificial material within the microelectromechanical system structures. The one or more components to be released may be, for example, a membrane of a sound transducer or a moveable mass of an acceleration sensor.

Figure 3:
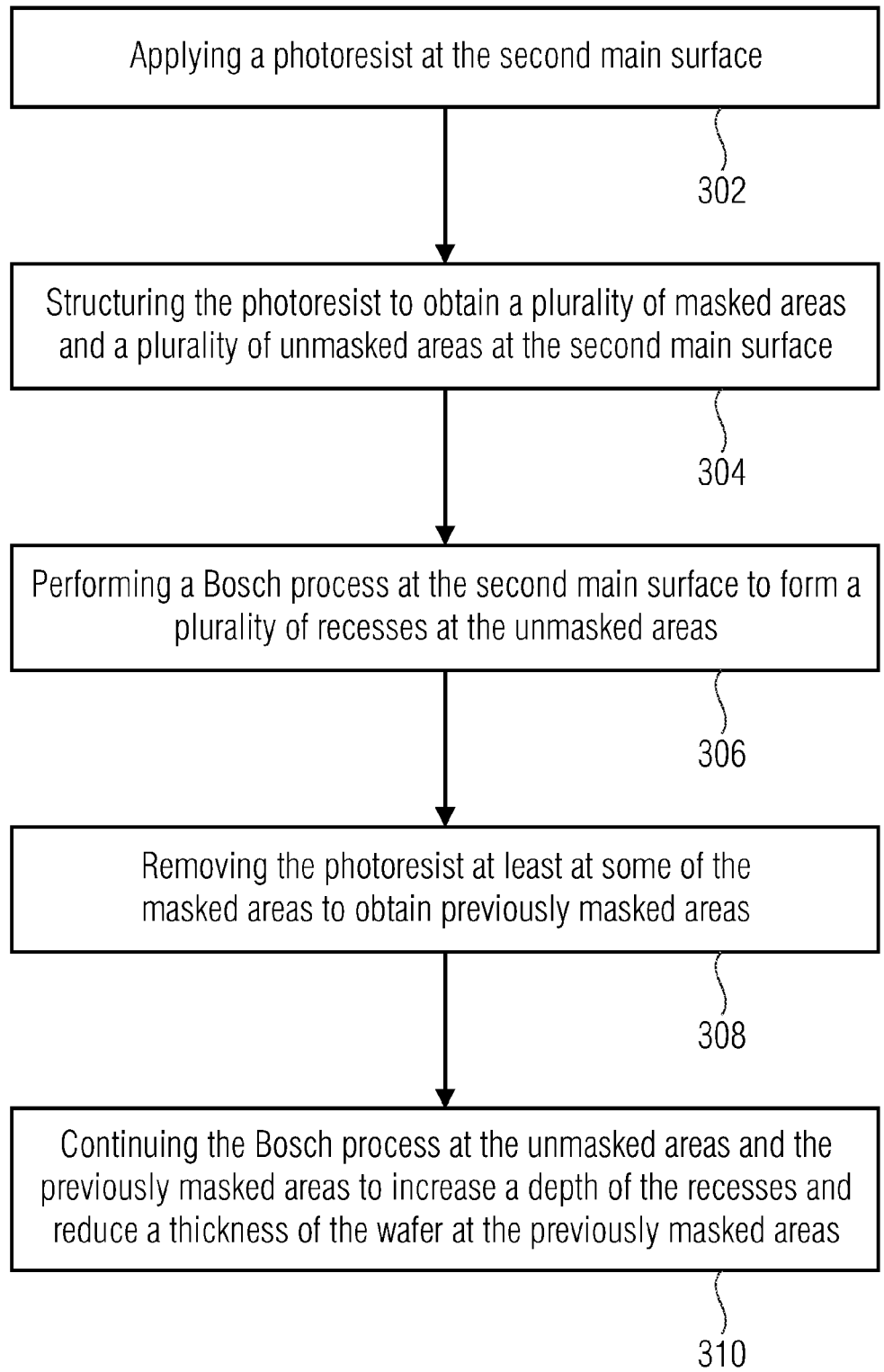
FIG. 3 is a schematic flow diagram of a method for processing a wafer according to further embodiments.

FIG. 3 shows a schematic flow diagram of a further method for processing a wafer according to embodiments. Again, the wafer has a first main surface and a second main surface. Microelectromechanical systems structures are arranged at the first main surface. The method comprises a step 302 of applying a photoresist at the second main surface. The photoresist functions as a masking material and is structured during a subsequent step 301. The structuring of the photoresist results in a plurality of masked areas and a plurality of unmasked areas at the second main surface of the wafer.

According to a step 306, a Bosch process is performed at the second main surface to form a plurality of recesses (e.g., cavities) at the unmasked areas. Subsequently, the photoresist is removed at least at some of the masked areas to obtain previously masked areas, as indicated at a step 308. According to some embodiments, not only a portion of the photoresist is removed, but substantially the entire photoresist. Moreover, the removal of the photoresist may not only involve the second main surface of the wafer, but also the first main surface. At least according to some embodiments, no further photolithography processes are required passed this stage so that any residual photoresist may be removed from the wafer.

The Bosch process may then be continued as indicated at a step 310, at the unmasked areas and the previously masked areas to increase a depth of the recesses and to reduce a thickness of the wafer at the previously masked areas. As mentioned above, the preciously masked areas may constitute substantially the entire second main surface (with the exception of the recesses and/or a rim area spared by the Bosch process) so that substantially the entire wafer is thinned until a desired final wafer thickness is reached.

Optional process steps and optional configurations of the method for processing a wafer described above in the context of FIGS. 1 and 2 may also be applicable to the method for processing a wafer according to the flow diagram shown in FIG. 3. Therefore, such combinations are herewith disclosed.

FIGS. 4A to 4H show schematic cross sections of a wafer at various stages of processing the wafer according to embodiments.

Figure 4A:
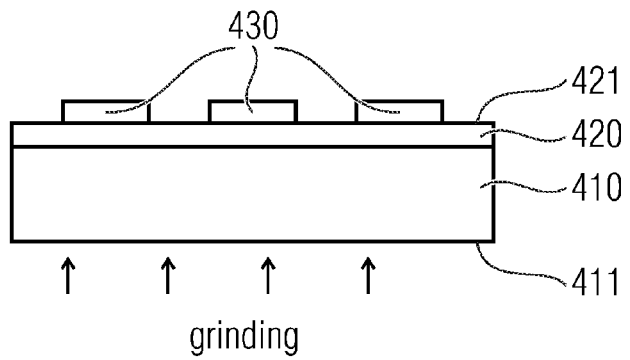
FIGS. 4A to 4H show schematic cross sections through a wafer at different stages of a method for processing a wafer according to embodiments.

FIG. 4A shows a schematic cross section of the wafer in its original state, i.e. prior to performing the method for processing a wafer according to embodiments. The wafer has already undergone some previous processing, in particular in order to form microelectromechanical system structures 430 at a first main surface 421 of the wafer. The wafer is mainly made up by a bulk material or substrate 410. An insulation layer 420 separates the bulk material or substrate 410 from the microelectromechanical system structure 430. The insulation layer 420 will later on function as an etch stop layer as will be explained below. The wafer further comprises a second main surface 411.

Figure 4B:
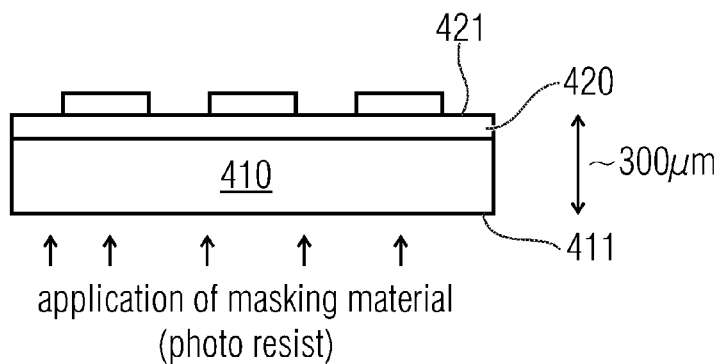

As can be seen in FIG. 4A, a grinding process is performed at the second main surface 411 in order to reduce a thickness of the wafer. In embodiments, the grinding process may be a TAIKO process. Instead of mechanically processing the second main surface 411, the second main surface 411 may also be etched in order to reduce the thickness of the wafer. In the embodiment illustrated in FIGS. 4A to 4H, the wafer thickness is reduced to approximately 300 μm, as illustrated in FIG. 4B. However, other values for this intermediate wafer thickness are also imaginable, for example ranging from 270 μm to 400 μm.

FIG. 4B further schematically illustrates the application of a masking material, e.g. a photoresist, to the second main surface 411 of the wafer.

Figure 4C:
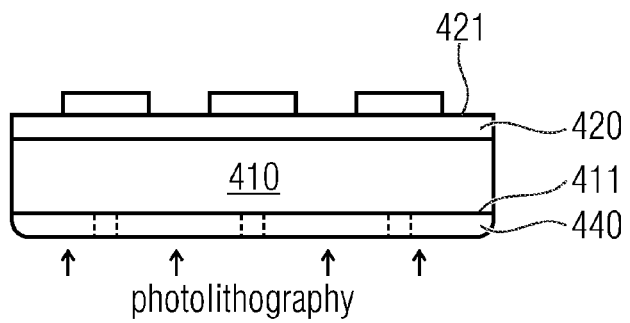

As schematically illustrated in FIG. 4C, a photolithography is performed at the second main surface in order to structure the masking material 440. The result of structuring the masking material 440 can be seen in FIG. 4D where three unmasked areas 442 are formed in the masking material 440. The masking material 440 that is still present at the second main surface 411 covers masked areas of the second main surface 411.

Figure 4D:
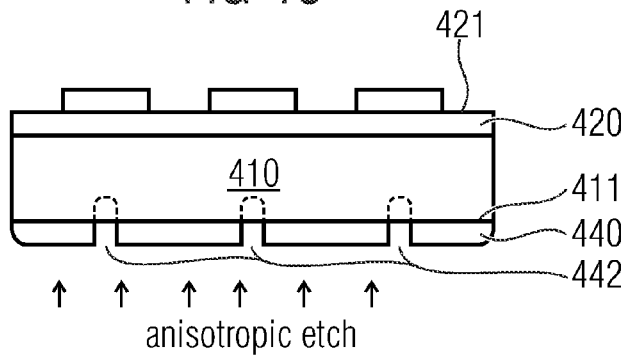

FIG. 4D further illustrates an anisotropic etch of the bulk material or substrate 410 of the wafer. The anisotropic etch acts in a locally confined manner on the bulk material 410, by means of the unmasked areas 442 within the masking material 440. A plurality of recesses is thus formed.

Figure 4E:
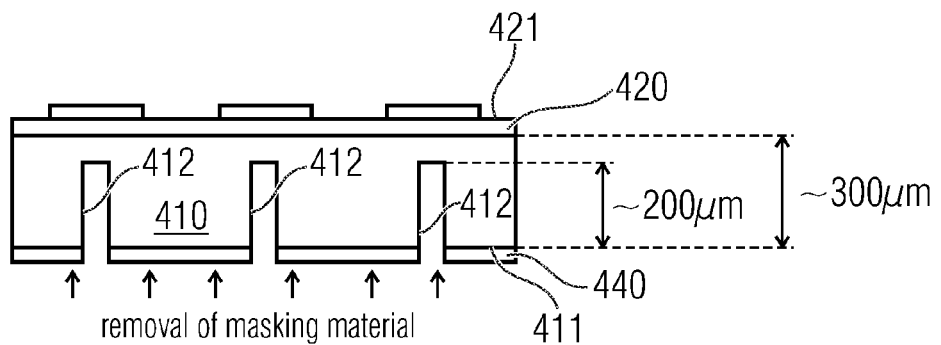

FIG. 4E shows a schematic cross section through the wafer after the anisotropic etching process of FIG. 4D. The anisotropic etching process of FIG. 4D substantially corresponds to the method steps 106, 208, and 306 of the flow diagram in FIG. 1, 2, or 3, respectively. A plurality of recesses 412 have been formed within the bulk material or substrate 410 of the wafer. In the example shown in FIG. 4E, the depth of the recesses 412 is approximately 200 μm from the second main surface 411. Each of the plurality of recesses has a relatively large aspect ratio, i.e. the depth of the recess 412 is relatively large compared to a lateral dimension of the recess 412. For example, the depth of each recess 412 may be equal to or greater than the diameter or width of the recess 412 (aspect ratio 1). In embodiments, the aspect ratio may be greater than 1, e.g., aspect ratio=1.5, aspect ratio=2, or aspect ratio=3.

FIG. 4E also schematically illustrates a removal of the masking material. This may be achieved by dissolving the masking material using a suitable solvent or agent.

Figure 4F:
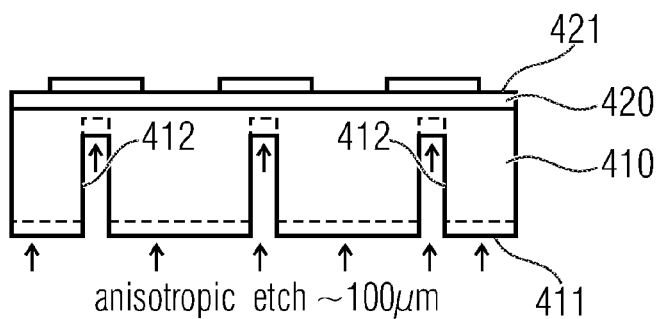

As schematically illustrated in FIG. 4F, a further anisotropic etch is performed at the second main surface 411 of the wafer. The masking material has been removed during the step that is illustrated in FIG. 4E so that now, during the process step schematically illustrated in FIG. 4D, also the previously masked areas are affected by the anisotropic etch. The depth of the plurality of recesses 412 is further increased and, at the same time, a wafer thickness at the previously masked areas is reduced (see dashed lines in FIG. 4F). The anisotropic etching process is continued at least until the recesses 412 have reached the insulation layer 420, which constitutes an etch stop layer for the anisotropic etching process. The anisotropic etching process reduces the wafer thickness at the previously masked areas by approximately 100 μm in the illustrated example.

Figure 4G:
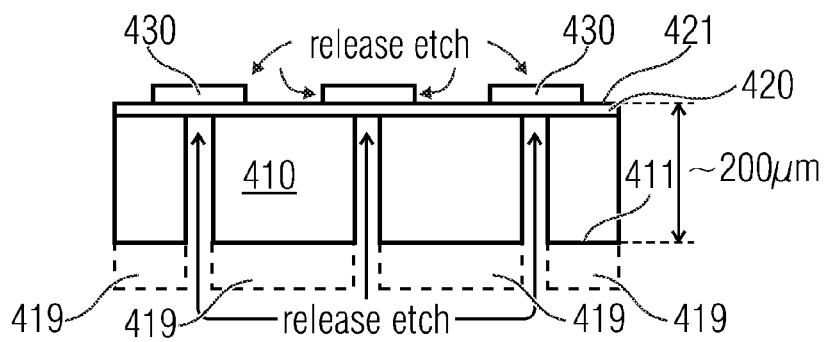

In FIG. 4G the wafer is schematically illustrated in cross section after the anisotropic etching process of FIG. 4F is finished. In FIG. 4G, dashed lines indicate the configuration of the wafer prior to the anisotropic etching process of FIG. 4F. The reference numeral 419 indicates those portions of the bulk material or substrate 410 that have been etched away by the anisotropic etching process. The wafer now has a wafer thickness of approximately 200 μm. A release etch may now be performed in order to remove the insulation layer 420 at least within the recesses 412 and/or to remove any sacrificial material within the microelectromechanical system structures 430. The release etching process may be a wet etching process. In the alternative, the sacrificial material may be, e.g. carbon, which can be removed by an ashing process. Using carbon as sacrificial material and performing an ashing process in order to release one or more components of the MEMS structures typically solves a number of problems associated with wet etching processes that have been previously used to release the MEMS components or sub-structures.

Figure 4H:
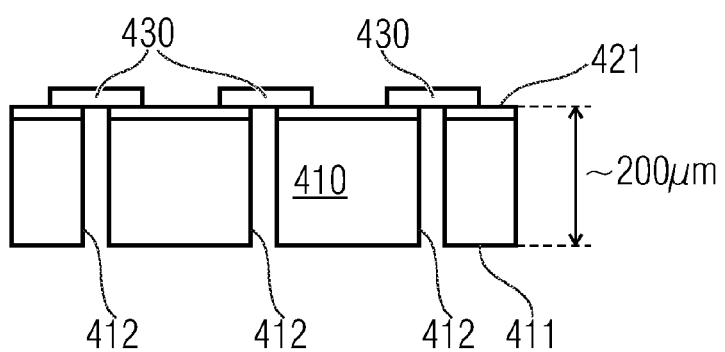

FIG. 4H shows a schematic cross section of the wafer at a final stage, typically just prior to singulating the wafer into a plurality of MEMS devices.

FIGS. 5A to 5D show schematic cross sections of a wafer at different processing stages of a method for processing a wafer according to embodiments. In particular, FIGS. 5A to 5D illustrate an area-wide or surface-wide back etching process for DSOUND and 200 μm wafer thickness.

FIG. 5A schematically illustrates a cross section of a wafer 410 having a wafer thickness of 725 μm. The thickness is measured between a first main surface 521 and a second main surface 511. At the first main surface 421, a plurality of microelectromechanical system structures 430 (for example, SIMIC DSOUND microphones) are arranged. The microelectromechanical system structures 530 are completely processed except for a final release etch step.

FIG. 5B schematically shows the wafer after its thickness has been reduced to 300 μm by means of grinding.

FIG. 5C schematically illustrates the wafer after a photolithography process that is used to form a plurality of cavities or recesses at the second main surface (back surface) and a time-controlled cavity etching process. The reference numeral 450 indicates a structured photoresist. Recesses 512 have been formed by etching the wafer substrate 510 via unmasked areas of the photoresist 540. The time-controlled cavity etching yields recesses or cavities 512 having a depth of approximately 200 μm.

FIG. 5D schematically illustrates the wafer after an area-wide Bosch back etching process without photoresist has been performed. In the example illustrated in FIG. 5D, a 100 μm, area-wide back etching has been performed. As a result, a 200 μm wafer thickness of the wafer is obtained.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

What is claimed is:

1. A method for processing a wafer having a first main surface and a second main surface, wherein microelectromechanical system structures are arranged at the first main surface, the method comprising:
applying a masking material at the second main surface;
structuring the masking material to obtain a plurality of masked areas and a plurality of unmasked areas at the second main surface;

anisotropically etching the wafer from the second main surface at the unmasked areas to form a plurality of recesses;

removing the masking material at least at some of the masked areas to obtain previously masked areas; and anisotropically etching the wafer from the second main surface at the unmasked areas and the previously masked areas to increase a depth of the recesses and reduce a thickness of the wafer at the previously masked areas.

2. The method according to claim 1, wherein anisotropically etching the wafer at the unmasked areas and the previously masked areas reduces the thickness of the wafer at the previously masked areas to a final wafer thickness.

3. The method according to claim 2, wherein the final wafer thickness is less than 250 μm.

4. The method according to claim 1, wherein, prior to applying the masking material, the wafer has a thickness between 270 μm and 400 μm.

5. The method according to claim 1, wherein anisotropically etching the wafer at the unmasked areas and the previously masked areas increases a depth of the recesses and reduces a thickness of the wafer by a value between 80 μm and 140 μm.

6. The method according to claim 1, further comprising reducing a given thickness of the wafer prior to applying the masking material by a mechanical process at the second main surface of the wafer.

7. The method according to claim 6, wherein the mechanical process comprises a TAIKO process.

8. The method according to claim 1, wherein the wafer comprises an insulation layer at the first main surface adjacent to the microelectromechanical system structures, the insulation layer being configured to function as an etch stop layer so that etching of the recesses stops when the etch stop layer is reached.

9. The method according to claim 8, further comprising removing the insulating layer at least within the recesses by use of a different etching process subsequent to anisotropically etching the wafer at the unmasked areas and the previously masked areas.

10. The method according to claim 1, further comprising, subsequent to anisotropically etching the wafer at the unmasked areas and the previously masked areas:

releasing one or more components of the microelectromechanical system structures by removing a sacrificial material within the microelectromechanical system structures.

11. The method according to claim 10, wherein the wafer comprises an insulation layer at the first main surface adjacent to the microelectromechanical system structures, the insulation layer being configured to function as an etch stop layer so that etching of the recesses stops when the etch stop layer is reached, and wherein the method further comprises:

removing the insulating layer at least within the recesses using the same process that is used for removing the sacrificial material within the microelectromechanical system structures.

12. The method according to claim 1, wherein anisotropically etching the wafer at the unmasked areas and the previously masked areas creates a rim area of the wafer so that the thickness of the wafer is not reduced in the rim area.

13. The method according to claim 1, wherein anisotropically etching the wafer at the unmasked areas comprises performing a time controlled process.

14. The method according to claim 1, wherein the microelectromechanical system structures comprise sound transducers.

15. The method according to claim 1, wherein the wafer has a diameter of at least 200 mm.

16. The method according to claim 1, wherein removing the masking material comprises removing all the masking material so that all masked areas are exposed.

17. A method for processing a wafer having a first main surface, a second main surface, and a diameter of at least 200 mm, wherein microelectromechanical system structures are arranged at the first main surface and an insulation layer separates the microelectromechanical system structures from a bulk material of the wafer, the method comprising:

reducing a thickness of the wafer by a mechanical process at the second main surface of the wafer to a wafer thickness between 270 μm and 400 μm;

applying a masking material at the second main surface;

structuring the masking material to obtain a plurality of masked areas and a plurality of unmasked areas at the second main surface;

anisotropically etching the wafer from the second main surface at the unmasked areas to form a plurality of recesses having a depth between 150 μm and 250 μm;

removing the masking material at least at some of the masked areas to expose previously masked areas;

anisotropically etching the wafer from the second main surface thereby increasing a depth of the recesses until the insulation layer is reached and thereby also reducing a thickness of the bulk material of the wafer to a final thickness of less than 250 μm; and removing portions of the insulation layer that are accessible via the recesses.

18. The method according to claim 17, further comprising releasing one or more components of the microelectromechanical system structures by removing a sacrificial material within the microelectromechanical system structures.

19. The method according to claim 17, wherein anisotropically etching the wafer at the unmasked areas and the previously masked areas increases a depth of the recesses and reduces a thickness of the wafer by a substantially identical value between 80 μm and 140 μm.

20. The method according to claim 19, wherein the mechanical process comprises a TAIKO process.

21. The method according to claim 17, wherein anisotropically etching the wafer at the unmasked areas and the previously masked areas creates a rim area of the wafer so that the thickness of the wafer is not reduced in the rim area.

22. The method according to claim 17, wherein anisotropically etching at the unmasked areas comprises performing a time controlled process.

23. The method according to claim 17, wherein the microelectromechanical system structures comprise sound transducers.

24. A method for processing a wafer having a first main surface and a second main surface, wherein microelectromechanical system structures are arranged at the first main surface, the method comprising:

applying a photoresist at the second main surface;

structuring the photoresist to obtain a plurality of masked areas and a plurality of unmasked areas at the second main surface;

performing a Bosch process at the second main surface to form a plurality of recesses at the unmasked areas;

removing the photoresist at least at some of the masked areas to obtain previously masked areas; and continuing the Bosch process at the unmasked areas and the previously masked areas to increase a depth of the recesses and reduce a thickness of the wafer at the previously masked areas.

25. A wafer comprising:
a stack of a bulk material and an insulating material, wherein the insulating material forms a first main surface of the wafer and the bulk material forms a second main surface of the wafer, the stack having a thickness extending from the first main surface to the second main surface between 150 µm and 250 µm;
a plurality of microelectromechanical system structures arranged at the first main surface; and
a plurality of recesses, each recess extending from the second main surface through the bulk material and the insulating material to a corresponding microelectromechanical system structure of the plurality of microelectromechanical system structures.

\* \* \* \* \*